(12) United States Patent
Poulin et al.

(10) Patent No.: US 9,136,802 B2
(45) Date of Patent: Sep. 15, 2015

(54) INTEGRATED START-UP BIAS BOOST FOR DYNAMIC ERROR VECTOR MAGNITUDE ENHANCEMENT

(71) Applicant: MICROSEMI CORPORATION, Aliso Viejo, CA (US)

(72) Inventors: Darcy Poulin, Carp (CA); Kyle Hershberger, Marietta, GA (US); Brian Eplett, Lilburn, GA (US); Mark Santini, Atlanta, GA (US)

(73) Assignee: Microsemi Corporation, Aliso Viejo, CA (US)

( * ) Notice: Subject to any disclaimer, the term of this patent is extended or adjusted under 35 U.S.C. 154(b) by 0 days.

(21) Appl. No.: 14/090,401

(22) Filed: Nov. 26, 2013

(65) Prior Publication Data

US 2014/0159817 A1    Jun. 12, 2014

Related U.S. Application Data

(63) Continuation-in-part of application No. 13/897,192, filed on May 17, 2013.

(60) Provisional application No. 61/648,504, filed on May 17, 2012.

(51) Int. Cl.
*H03F 3/21* (2006.01)
*H03G 3/00* (2006.01)
(Continued)

(52) U.S. Cl.
CPC ............... *H03F 3/21* (2013.01); *H03F 1/0261* (2013.01); *H03F 1/0266* (2013.01); *H03F 1/305* (2013.01); *H03F 3/19* (2013.01); *H03G 3/004* (2013.01);
(Continued)

(58) Field of Classification Search
USPC .................................. 330/285, 296, 289, 273
See application file for complete search history.

(56) References Cited

U.S. PATENT DOCUMENTS 5,438,298 A    8/1995    Hori
6,233,440 B1   5/2001    Taylor
(Continued)

FOREIGN PATENT DOCUMENTS

EP    1976111 A2    10/2008
GB    2181916 A     4/1987

OTHER PUBLICATIONS

European Patent Office, International Search Report/Written Opinion, PCT/US2013/041671, Jul. 29, 2013, 13 pages, EPO, Rijswijk, The Netherlands.
(Continued)

*Primary Examiner* — Hieu Nguyen
(74) *Attorney, Agent, or Firm* — Marger Johnson

(57) ABSTRACT

Devices and methods for correcting for start-up transients in integrated power amplifier are disclosed. A power amplifier is responsive to a bias control output and is arranged to provide an amplified power output. In some examples, the boost current is adjusted based on a supply voltage and an input power of the power amplifier. The power amplifier can operate in a low power and a high power mode and the adjustments can be made to the supply voltage and/or the input power vary depending on whether the power amplifier is operating in the high or low power mode. The adjustments for the high power mode operation are different than and correspond to the high power mode input power and voltage and the adjustments for the low power mode operation are different than and correspond to the low power mode input power and voltage.

13 Claims, 14 Drawing Sheets

(51) Int. Cl.
*H03F 1/02* (2006.01)
*H03F 1/30* (2006.01)
*H03F 3/19* (2006.01)
*H03G 3/30* (2006.01)

(52) U.S. Cl.
CPC .......... *H03G 3/3042* (2013.01); *H03F 2200/18* (2013.01); *H03F 2200/321* (2013.01); *H03F 2200/504* (2013.01); *H03F 2200/507* (2013.01)

(56) References Cited

U.S. PATENT DOCUMENTS

| | | | |
|---|---|---|---|
| 7,567,123 B2 | 7/2009 | Leung et al. | |
| 8,264,272 B2 | 9/2012 | Zhang et al. | |
| 8,692,619 B2 * | 4/2014 | Wakita et al. | 330/296 |
| 2002/0153940 A1 | 10/2002 | Wurcer et al. | |
| 2005/0140437 A1 | 6/2005 | Maclean et al. | |
| 2005/0270103 A1 | 12/2005 | Constantin | |
| 2006/0164168 A1 | 7/2006 | Liu et al. | |
| 2009/0160558 A1 | 6/2009 | Choi et al. | |
| 2009/0212863 A1 | 8/2009 | Ishimaru | |
| 2011/0090011 A1 | 4/2011 | Chang et al. | |

OTHER PUBLICATIONS

Calhoun, B., et al., "Standby Voltage Scaling for Reduced Power," Custom Integrated Circuits Conference, 2003, Proceedings of the IEEE 2003, Sep. 21-24, 2003, pp. 639-642.

Microsemi Corporation, LX5586 4.8-5.85GHz, IEEE802.11ac Front End Module, Preliminary Product Brief, Analog Mixed Signal Group, One Enterprise, Aliso Viejo, California, Rev. 0.1, Nov. 2012.

Microsemi Corporation, LX5509 InGaP 5GHz Power Amplifier, Abridged Datasheet, Analog Mixed Signal Group, One Enterprise, Aliso Viejo, California, Rev. 1.0, Dec. 19, 2012.

USPTO, Office Action issued in U.S. Appl. No. 13/897,192, Sep. 11, 2014, pp. 1-17, Commissioner for Patents, Alexandria, Virginia 22313-1450.

USPTO, Office Action issued in U.S. Appl. No. 13/895,236, Dec. 18, 2014, pp. 1-17, Commissioner for Patents, Alexandria, Virginia 22313-1450.

* cited by examiner

INTEGRATED START-UP BIAS BOOST FOR DYNAMIC ERROR VECTOR MAGNITUDE ENHANCEMENT

CROSS REFERENCE TO RELATED APPLICATIONS

This application is a continuation-in-part of and claims the benefit of co-pending U.S. patent application Ser. No. 13/897,192, filed May 17, 2013, which claims the benefit of U.S. Provisional Patent Application Ser. No. 61/648,504, filed May 17, 2012, all of which are incorporated by reference herein in their entirety.

FIELD OF THE INVENTION

This disclosure relates to enhancing power amplifier performance and more particularly to enhancing power-on performance of a power amplifier in an integrated circuit.

BACKGROUND OF THE INVENTION

Power amplifiers may be integrated onto the same die as receiving or other types of amplifiers in many communications standards, such as wireless LAN. A switch permits transmission of signals through the antenna to/from either the power amplifier circuit or the receiving or other amplifier, depending on the needs of the communications circuit. When the power amplifier is transmitting signals, power is supplied to the power amplifier. When the power amplifier is not actively transmitting signals, power is not supplied to the power amplifier. Upon powering on, the power amplifier experiences a period of time during which the signal that is transmitted is changing and the transmission characteristics of the power amplifier are also changing, which is difficult to train or characterize by other circuit components or other circuits coupled to the power amplifier circuit. In some circumstances such as Wireless LAN, the receiving circuit that receives the signal transmitted from the power amplifier is arranged to determine the characteristics of the incoming signal from the power amplifier within a finite period of time after which the receiving circuit assumes that the signal changes remain consistent upon further receipt of the signal over time.

The time period during which the receiving circuit determines the characteristics of the incoming signal from the power amplifier may be relatively short, approximately 4 µs in some wireless LAN examples, compared to the time period during which the power amplifier is powering on and during which the transmission characteristics of the power amplifier signal are changing and the manner in which they are changing is also changing. This assumption of no further changes to the manner in which the signal is changing leads to the receiving circuit assuming that the power amplifier signal is not continuing to change in the same manner when in fact the characteristics of the power amplifier signal are continuing to change, which can lead to inaccuracies in how the signal is being processed by the receiving circuit.

To accommodate for changing transmission characteristics during the powering-on time period of the power amplifier, a reference circuit has been coupled to the power amplifier to generate a complementary reference current to the current flowing through the power amplifier. The complementary reference current produced by the reference circuit has an input of a voltage from a control source that is then converted to the reference current by the reference circuit. A reference circuit resistor sets both the steady state current value and the time constant or delay. A reference circuit capacitor value becomes fixed as a result of the fixed value for the reference circuit resistor. The steady state current value requires that the capacitor value be relatively large and that value can be upwards of 100 nF in some examples. It is not practical for such a large capacitor to be physically present on die and therefore it must be located off-die.

Many WLAN devices operate at high transmit power levels, typically between 16 and 20 dBm, and use a supply voltage which is typically 3.6V, to transmit signals between the device and a remote access point. High transmit power is required since the remote access point may be a considerable distance away from the WLAN device. Recently, devices incorporating features such as WiFi Direct® and personal hotspots have been implemented. In this operating mode, WLAN devices are often quite close to one another, and lower transmit power can be tolerated.

However, current WLAN devices do not have an option to efficiently operate at low power levels, which results in power being wasted during the closer proximity signal transmissions because the power amplifiers are configured to operate at the high power level. Such high power level operation leads to inefficient use of the power sources. Further, current WLAN devices that have been optimized for high power level operation are not capable of accurately correcting for start-up transients when a WLAN device power amplifier is operated at low power levels, which leads to inaccuracies when the signal is processed at the receiving circuit.

Therefore, advancements in the art that provide for WLAN devices with increased power efficiency that are size, cost, and power efficient are desirable.

SUMMARY OF THE INVENTION

An object of this invention is to provide methods and device structures suitable for correcting for start-up transients in power amplifiers.

An example circuit that corrects for start-up transients in power amplifiers includes a boost generator, a reference element, a bias element, and a power amplifier. The boost generator can include a delay element, a transconductance element, or both. The delay element is arranged to produce a delay waveform signal that is responsive to an input voltage signal. The transconductance element has an input that receives the delay waveform signal from the delay element and is arranged to provide an output boost current that is based on the delay waveform signal and a gain of the transconductance element. The reference element provides an output bias current that is responsive to a static reference current and the boost current. The bias element has an input that receives the bias current and is arranged to provide a bias control output. The power amplifier is responsive to the bias control output and is arranged to provide an amplified power output. The power amplifier provides a first amount of power gain during a first time period after the power amplifier is powered on and a second amount of power gain during a second time period following the first time period after the power amplifier is powered on. The first amount of power gain is responsive to the sum of the boost current and the static reference current. The second amount of power gain is determined by decay of the output bias current to a value of the static reference current.

Methods of correcting for a start-up transient in a power amplifier include producing a boost current having a decay characteristic, producing a static reference current, summing the boost current and the static reference current, and applying the summed boost current and the static reference current to bias the power amplifier. Methods of correcting for a start-up transient in power amplifiers may also include adjusting the boost current based on a supply voltage of the power amplifier and an output power of the power amplifier.

The disclosed power amplifiers can operate in a low power level and a high power level mode. The power amplifiers can be part of a wireless local area network device. The power amplifier can receive a control signal when it is powered on that indicates that the power amplifier is to operate at the high power level in which case the power amplifier is then operated at the high power level after being powered on. Alternatively, the power amplifier can receive a control signal when it is powered on that indicates that the power amplifier is to operate at the low power level in which case the power amplifier is operated at the low power level after being powered on. The high power level has a high power level supply voltage and the low power level can have either the same high power level supply voltage or alternatively a low power level supply voltage, depending on the embodiment.

As discussed above, the power amplifier can operate at either the high power level or the low power level after being powered on, depending on whether the control signal indicates operation of the power amplifier at the high power level or the low power level. Also discussed above are methods for correcting for start-up transients when the power amplifier is powered on. Correcting for the start-up transients of the power amplifiers when the power amplifier is powered on can differ depending on whether the control signal received by the power amplifier upon powering on indicates that the power amplifier is to operate at the high power level or the low power level.

For example, if the control signal indicates that the power amplifier is to operate at the high power level, a high power level boost current is produced that has a high power level decay characteristic. The high power level boost current is based on the high power level. A high power level static reference current is also produced and is based on the high power level. The high power level boost current may be adjusted by a high power level scaling factor that is based on the to high power level supply voltage to the power amplifier. The high power level boost current and the high power level static reference current are summed and applied to bias the power amplifier for the high power level.

A similar process can occur when the power amplifier is powered on by a control signal that indicates that the power amplifier is to operate the low power level. A low power level boost current is produced that has a low power level decay characteristic. The low power level boost current is based on the low power level. A low power level static reference current is also produced and is based on the low power level. The low power level boost current may be adjusted by a low power level scaling factor that is based on the low power level supply voltage to the power amplifier. The low power level boost current and the low power level static reference current are summed and applied to bias the power amplifier for the low power level. The low power level static reference current is typically lower than the high power level reference current, which results in reduced power consumption of the power amplifier device when operating at the low power level.

Further, the supply voltage applied to the power amplifier may also be adjusted in combination with the start-up transient correction when the power amplifier receives the control signal indicating it is to operate at the low power level. The supply voltage is typically set to a high power level supply voltage and may be adjusted to a low power level supply voltage, in some example embodiments. Operation of the power amplifier at the high power level indicates that the high power level supply voltage is applied. Operation of the power amplifier at the low power level indicates that the power amplifier can be operated at either the high power level supply voltage or adjusted down to a low power level supply voltage, depending on the embodiment. Correction for the start-up transients experienced by the power amplifier is adjusted for operation of the power amplifier at the low power level regardless of the applied supply voltage value.

The foregoing and other objects, features and advantages of the invention will become more readily apparent from the following detailed description with reference to the accompanying drawings.

DETAILED DESCRIPTION

Figure 1:
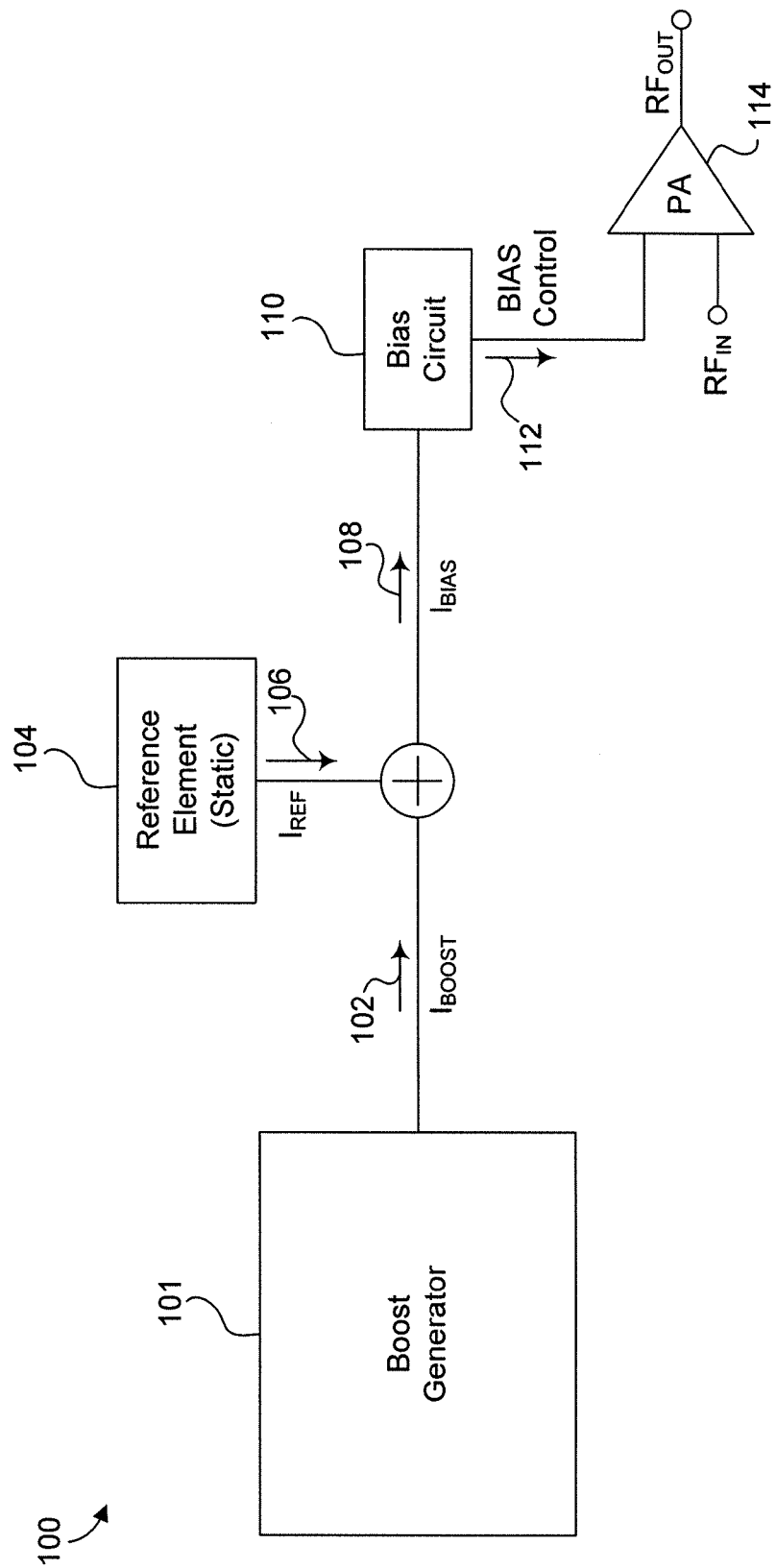
FIG. 1 is a block diagram that corresponds to elements of an integrated start-up bias boost circuit for a power amplifier, in accordance with aspects of the invention.

In the drawings, which are not necessarily to scale, like or corresponding elements of the disclosed systems and methods are denoted by the same reference numerals.

To correct for start-up transients inherent in power amplifiers, such as the LX5586 and LX5590 power amplifiers manufactured by Microsemi Corporation®, the disclosed circuits and methods provide for separating the circuit elements used to set the delay from those circuit elements used to set the output magnitude of the bias current and the characteristics of the output signal of the power amplifier. By separating the delay and the output magnitude of the bias current, the output signal of the power amplifier compensates for the start-up transients inherent in power amplifiers, in many environments, specifically in a monolithic solution for example. This arrangement can provide adjustable control mechanisms and the ability to control the circuit's behavior hi any standard CMOS/BiCMOS process.

Referring now to FIG. 1, a circuit that corrects for start-up transients in power amplifiers 100 is illustrated in a block diagram. The circuit 100 includes a boost generator 101 that provides a boost current 102, a reference element 104 that provides a reference current ($I_{REF}$) 106, a bias element or bias circuit 110 that provides a bias control output 112 and a power amplifier 114. The currents $I_{BOOST}$ 102 and $I_{REF}$ are summed to produce an output bias current, $I_{BIAS}$ 108 that is received as input to the bias circuit 110. The bias circuit 110 produces a bias control output 112 based on $I_{BIAS}$ 108. The power amplifier 114 is responsive to the bias control output 112 and is arranged to provide an amplified power output ($RF_{OUT}$).

Figure 2:
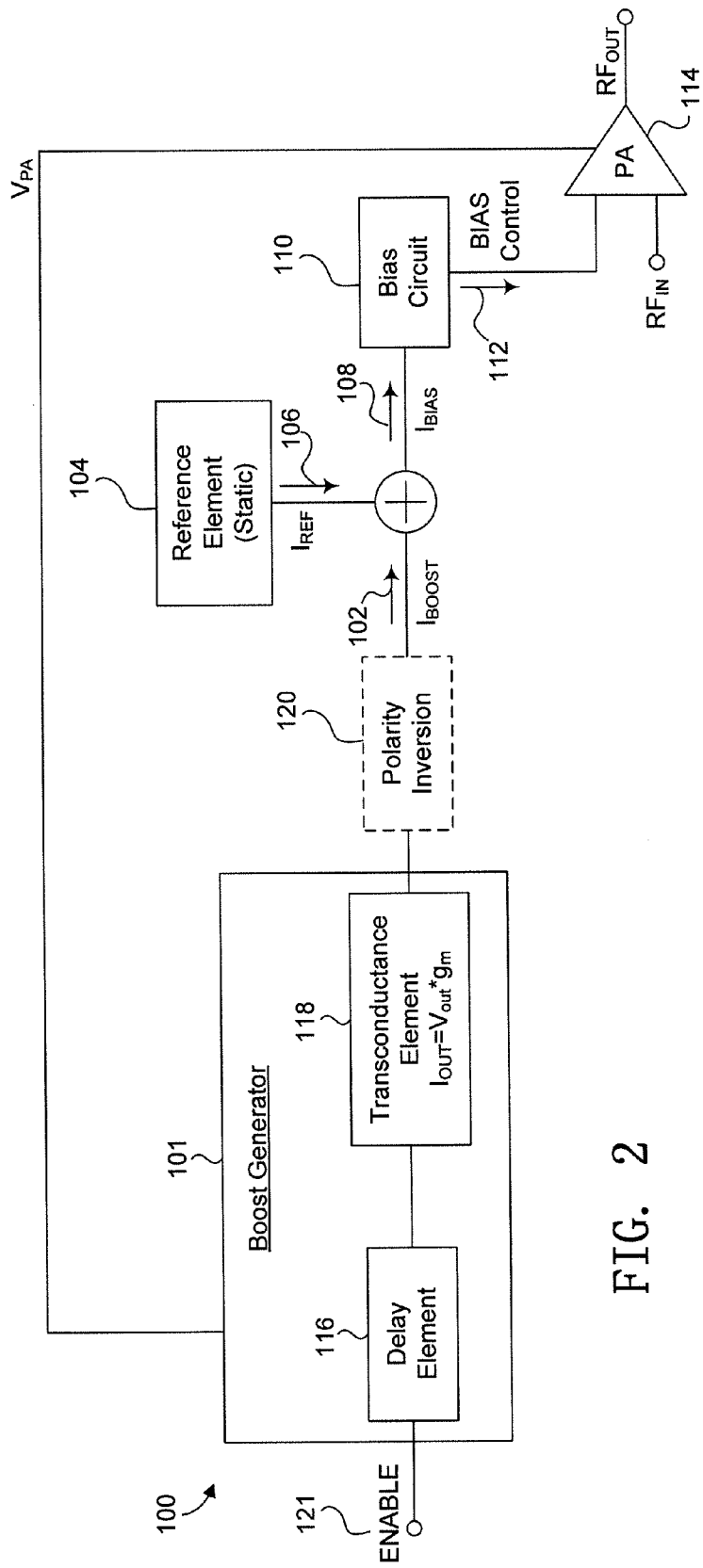
FIG. 2 is another block diagram showing elements of the integrated start-up bias boost circuit for a power amplifier shown in FIG. 1.

FIG. 2 shows a block diagram corresponding to the circuit elements shown in FIG. 1 along with additional elements of the boost generator. Specifically, the example boost generator 101 shown in FIG. 2 includes a delay element 116 and a transconductance element 118.

Optionally, the correcting circuit 100 can also include a polarity inversion circuit 120. The delay element 116 is arranged to produce a delay waveform signal that is responsive to an input signal. In other examples, a switch of any kind can generate the input voltage signal that is received at the input of the transconductance element 118. The transconductance element 118 has an input that receives the delay waveform signal from the delay element 116 and is arranged to provide an output boost current ($I_{BOOST}$) 102 that is based on the delay waveform signal and a gain of the transconductance element 118. The reference element 104 may be a bias reference element that provides a static reference current ($I_{REF}$) 106. The currents $I_{BOOST}$ 102 and $I_{REF}$ 106 are summed to produce an output bias current ($I_{BIAS}$) 108 that is received as the input to the bias circuit 110. The bias circuit 110 produces a bias control output 112 based on $I_{BIAS}$ 108. The power amplifier 114 is responsive to the bias control output and is arranged to provide an amplified power output, as discussed above.

The power amplifier 114 shown in FIGS. 1 and 2 provides a first amount of power gain during a first time period after the power amplifier is powered on and a second amount of power gain during a second time period after the power amplifier is powered on. The second time period is after the first time period in this example. The first amount of power gain is responsive to the sum of $I_{BOOST}$ and $I_{REF}$. The second amount of power gain is determined by the decay of the output bias current $I_{BIAS}$ portion of the output control bias toward a value of the static reference current, $I_{REF}$, which occurs over time. For example, the first time period and the second time period extend over about 100 μs after the power amplifier is powered on. The first time period may begin when an enabling control signal 121 is supplied to the power amplifier, in some examples, which may be concurrent with or slightly before or after the power amplifier is powered on. At the end of the first time period, the output bias current $I_{BIAS}$ value of the bias control output has peaked in value and has decayed toward the value of the static reference current $I_{REF}$.

The transconductance element 118 of the block diagram of the start-up bias boost circuit 100 illustrated in FIG. 2 converts the delay waveform signal that it receives at its input into an output current with an output gain. In some examples, the delay waveform signal includes a delay waveform voltage that is converted to an output current by the transconductance element 118. Optionally, the output current of the transconductance element 118 is received as input to a polarity inversion circuit 120. The polarity inversion circuit 120 can turn a current sink into a current source. For example, when the transconductance element 118 outputs a current that needs amplifying, then the current is transmitted through the polarity inversion circuit 120, or current mirror circuit, to amplify the current to its maximum value. When the output current of the transconductance element 118 is correct, such as being equal to its maximum value, then the polarity inversion circuit 120 can be bypassed. Regardless, the output current of the transconductance element 118, whether or not it passes through the polarity inversion circuit 120, produces the output boost current, $I_{BOOST}$ 102. In the examples in which the output current of the transconductance element 118 is transmitted through the polarity inversion circuit 120, the polarity inversion circuit 120 receives the boost current from the output of the transconductance element 118 and is arranged to provide an output current that is a mirrored boost current. The mirrored boost current or simply the boost current is depicted as $I_{BOOST}$ in FIG. 2.

The output bias current, $I_{BIAS}$, is responsive to $I_{BOOST}$ or the mirrored boost current, depending on whether the current is transmitted through the polarity inversion circuit 120. In the examples in which the current is transmitted through the polarity inversion circuit 120, the output bias current, $I_{BIAS}$, is the sum of the static reference current, $I_{REF}$, and the mirrored boost current. In the examples in which the current bypasses the polarity inversion circuit 120, the output bias current, $I_{BIAS}$, is the sum of the static reference current $I_{REF}$ and the boost current output from the transconductance element 118.

Figure 3A:
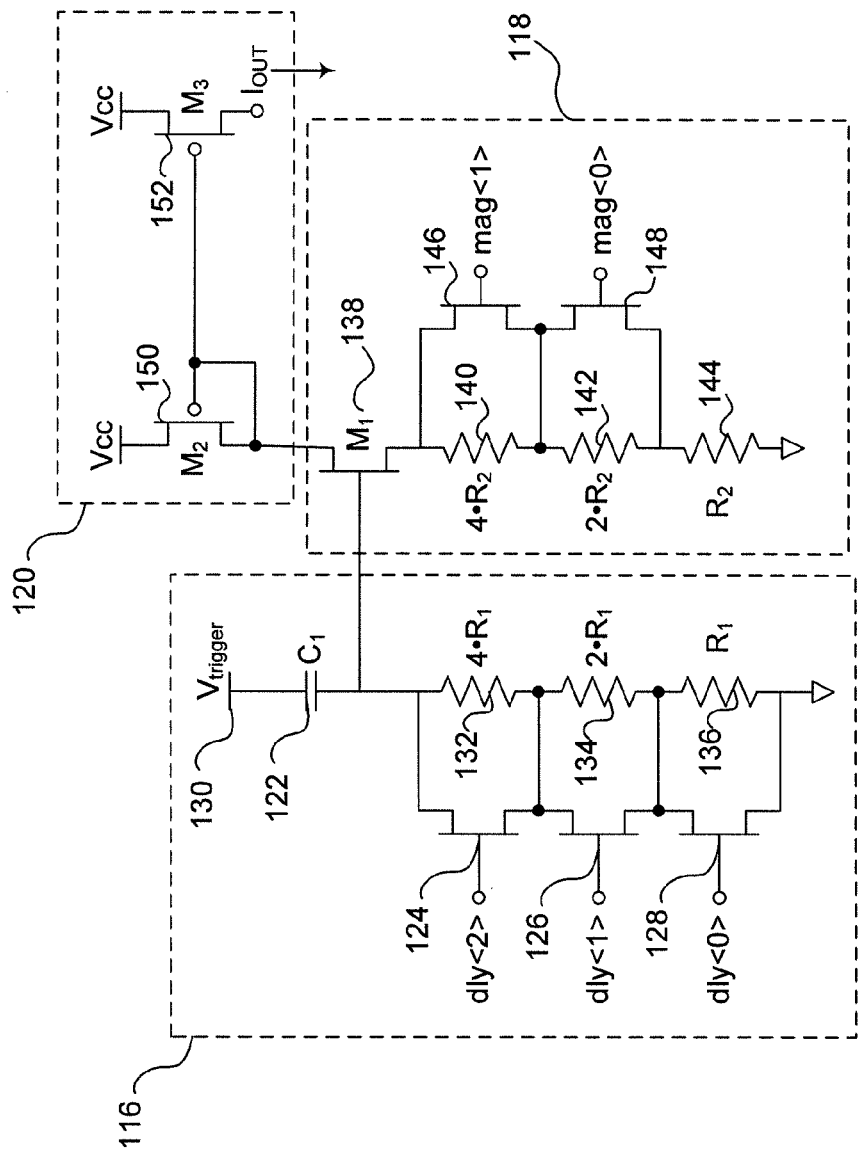
FIG. 3A is a schematic of an example delay element, transconductance element, and optional polarity inverter of an integrated start-up bias boost circuit for a power amplifier in accordance with aspects of the disclosure.
Figure 3B:
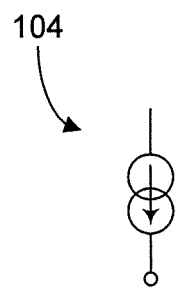
FIG. 3B is a schematic of an example bias reference element of an integrated start-up bias boost circuit for a power amplifier, according to aspects of the disclosure.
Figure 3C:
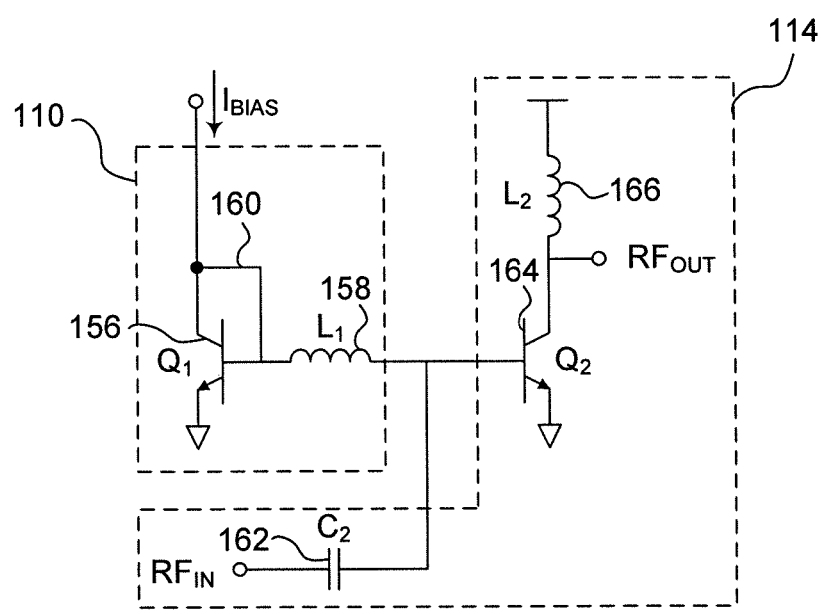
FIG. 3C is a schematic of an example bias circuit and a power amplifier of an integrated start-up bias boost circuit for a power amplifier, in accordance with aspects of the disclosure.

FIGS. 3A-3C show example schematics of some elements of the start-up bias boost circuit 100 discussed in FIGS. 1 and 2. These are examples and other embodiments of the correcting circuits may be implemented in accordance with this disclosure. FIG. 3A is an example schematic of a delay element 116, a transconductance element 118, and a polarity inversion circuit 120. The delay element 116 can be a resistor-capacitor (RC) charge circuit, in some examples, in which a capacitor 122 begins to charge when the trigger voltage input 130 transitions from low (0V) to high. A combination of the delay switches 124, 126, 128 are closed to select one of delays d<0>, d<1>, or d<2>. The voltage input 130 to the delay element 116 ranges from 0V when voltage is not being supplied to the delay element 116 to approximately 3.3V when voltage is supplied to the delay element 116 and the capacitor 122 begins to charge the RC charge circuit, for example. In alternative examples, the delay element can include one or more simple switches or other circuit elements that provide power to the start-up bias boost circuit.

In the example shown in FIG. 3A, the delay element 116 includes the capacitor 122 and a series of digitally controllable resistors 132, 134, 136 electrically coupled together in series. However, in alternative examples, the capacitor may be electrically coupled to a single resistor or any other suitable number of resistors. In addition, switching elements may be used in combination with multiple capacitors to provide adjustable delays. Again referring to FIG. 3A, the series of resistors 132, 134, 136 are digitally selectable by their respective switches 124, 126, 128, such as field effect transistors (FETs) for example, or any other suitable switch. In this example, when FETs 124, 126 are closed (conducting) and FET 128 is open (non-conducting), the resistance of the delay element 116 becomes the value of $R_1$. When FETs 124, 128 are closed and FET 126 is open, the resistance becomes the value of $2*R_1$, in this example. When FETs 126, 128 are closed and FET 124 is open, the resistance of the delay element 116 becomes the value of $4*R_1$, in this example. By varying the FETs 124, 126, 128 that are open and closed, the resistance value of the delay element 116 can be controlled. By controlling the resistance value of the delay element 116, the delay waveform signal's response to the input voltage signal received by the delay element 116 can also be controlled.

The output voltage signal of the delay element 116 is received at the input of the transconductance element 118, which produces an output boost current. The transconductance element 118 includes an amplifying device 138 or transistor and a series of resistors 140, 142, 144 electrically coupled together in series. In the example transconductance element 118 shown in FIG. 3A, the amplifying device 138 is a FET, for example, or can be any other suitable type of amplifying device. The resistors 140, 142, 144 can be one large resistor in other examples. However, in FIG. 3A, the resistors 140, 142, 144 are a series of three digitally selectable resistors electrically coupled together in series. These resistors 140, 142, 144 are digitally controlled by two switches 146, 148 that vary the resistance and thus the output boost current that is output from the transconductance element 118. The transconductance element 118 has a minimum resistance of $R_2$ that may increase depending on whether one or both of the switches 146, 148 are open or closed.

The output boost current of the transconductance element 118 is received as input to the polarity inversion circuit 120 shown in FIG. 3A. The polarity inversion circuit 120 includes two metal oxide semiconductor field effect transistors 150, 152 (MOSFETs), in this example, electrically coupled in series to each other. The polarity inversion circuit 120 generates a mirrored output boost current that is greater than, but directly proportional to the boost current output by the transconductance element 118.

FIG. 3B is an example reference element 104. The reference element 104 can be a static reference element that is arranged to provide a static reference current that sets an operating parameter of the power amplifier, namely the current that flows through the power amplifier's bipolar transistor.

Turning now to FIG. 3C, example schematics of the bias circuit 110 and the power amplifier 114 are shown. The bias circuit 110 receives the summed bias current of the output boost current, the output current from FIG. 3A, and the static reference current, the output current from FIG. 3B. The bias circuit 110 shown in FIG. 3C includes a bipolar transistor 156 and an inductor 158 electrically coupled in series with each other. A bypass pathway 160 couples the gate to the collector of the bipolar transistor 156, thus effectively turning the bipolar transistor 156 into a diode. The bias circuit 110 provides an elevated bias voltage to the power amplifier 114 when the power amplifier 114 is powered on, which helps to correct for the changes in performance characteristics of the power amplifier 114 during the powering on time period.

FIG. 3C also shows an example schematic of a power amplifier 114 having a capacitor 162, a bipolar transistor 164, and an inductor 166. An input signal to the power amplifier 114 is a radio frequency (RF) input and the output of the power amplifier 114 is an RF output signal that is amplified by a gain defined by the power amplifier 114. When the power amplifier 114 is powered off, the current through the bipolar transistor 164 of the power amplifier 114 is essentially zero. When the power amplifier 114 is powered on, the current through the bipolar transistor 164 rapidly changes and then gradually approaches its steady state value. During the time period when the current through the bipolar transistor 164 is changing, the RF characteristics of the power amplifier 114 are also changing. The steady state value of the current through the bipolar transistor 164 of the power amplifier 114 is proportional to the value of the static reference current 106. The bias control current is a current boost that, when summed with the static reference current and input into the power amplifier 114, helps to correct for the changes to the RF characteristics of the power amplifier 114 when it is powered on during its "transient" period, which otherwise has a negative impact on the overall system performance.

The bias circuit 110 generates the bias voltage for the bipolar transistor 164 of the power amplifier 114. The operating point of the bipolar transistor 164 of the power amplifier 114 is set by the static reference current that flows through the reference device 156 of the bias circuit 110. As discussed above, the input current to the bias circuit 110 is generated by summing the static reference current and the output current boost. When the power amplifier 114 is powered off, the control voltage 130 ($V_{trigger}$) to the start-up bias boost circuit 100 is brought to ground, which resets the circuit 100 in the examples shown in FIGS. 1-3C. In alternative embodiments, the circuit 100 can have a constant supply voltage (although the value of the supply voltage may vary) and the circuit can be reset through other ways, such as FET switches.

In the examples shown in FIGS. 3A-3C, the start-up bias boost circuit 100 has two design equations:

$$t_{delay}=(R_1*C_1) \text{ seconds}$$

$$I_{BOOST,max}=(V_{CC}-V_{M1})/R_2 \text{ amps}$$

The start-up bias boost circuit design equations have three degrees of freedom—$C_1$, $R_1$, and $R_2$. $C_1$ is the capacitor 122 included in the delay element 116 of the start-up bias boost circuit 100 and is generally fixed by layout constraints and can be chosen to be as large as conventionally possible. To achieve the desired delay, which is in the range of 100's of µs, $R_1$ corresponding to the resistance value 132, 134, 136 of the delay element 116 also tends to be relatively large, such as 2 MΩ. To achieve the desired magnitude of the output boost current, the value of $R_2$ corresponding to the resistance value 140, 142, 144 of the transconductance element 118 can be chosen independently of $R_1$ and $C_1$. All three degrees of freedom, $C_1$, $R_1$, and $R_2$, are controllable to change the value of the desired delay and the output boost current.

As discussed above, before the power amplifier 114 is powered on, the control voltage 130 to the delay element 116 is zero, which means that all node voltages are also zero and the static reference current is zero. The diode 156 in the bias circuit 110 and the bipolar transistor 164 in the power amplifier 114 are off and the voltage across $C_1$ 122 of the delay element 116 is zero. When the power amplifier 114 is powered on, the static reference current is turned on, in some examples to a value of 100 µA. The control voltage 130 to the boost circuit 100 is also brought up to a desired value, in some examples to 3.3V. The transition of control voltage 130 may be coincident, slightly before, or slightly after the static reference current is turned on. The voltage across $C_1$ 122 is still zero, which brings the gate voltage of the transistor 138 in the transconductance element 118 up to the control voltage 130, which causes the transistor 138 to turn on. The source degeneration provided by $R_2$ 140, 142, 144 limits the drain current, which allows for the current through transistor 138 to be approximately $I_{BOOST,max}=(V_{CC}-V_{M1})/R_2$, as discussed above.

With increasing time, the voltage across $C_1$ 122 increases with an inverse exponential characteristic. The rate at which the voltage across $C_1$ 122 increases is controlled by the value of $R_1$ 132, 134, 136. As $C_1$ 122 charges, the gate voltage of transistor 138 in the transconductance element 118 decreases exponentially, which causes the current that flows through transistor 138 to decrease exponentially as well. This decrease in the current that flows through transistor 138 generates an exponential decay of the output boost current. When the voltage across $C_1$ 122 becomes equal to $V_{CC}-V_{Threshold\,voltage\,of\,M1}$, which happens over time, transistor 138 turns off and the current through transistor 138 becomes zero. This change results in the output boost current decaying to zero and the bias current becomes equal to the static reference current, which is the desired steady state condition.

Figure 4:
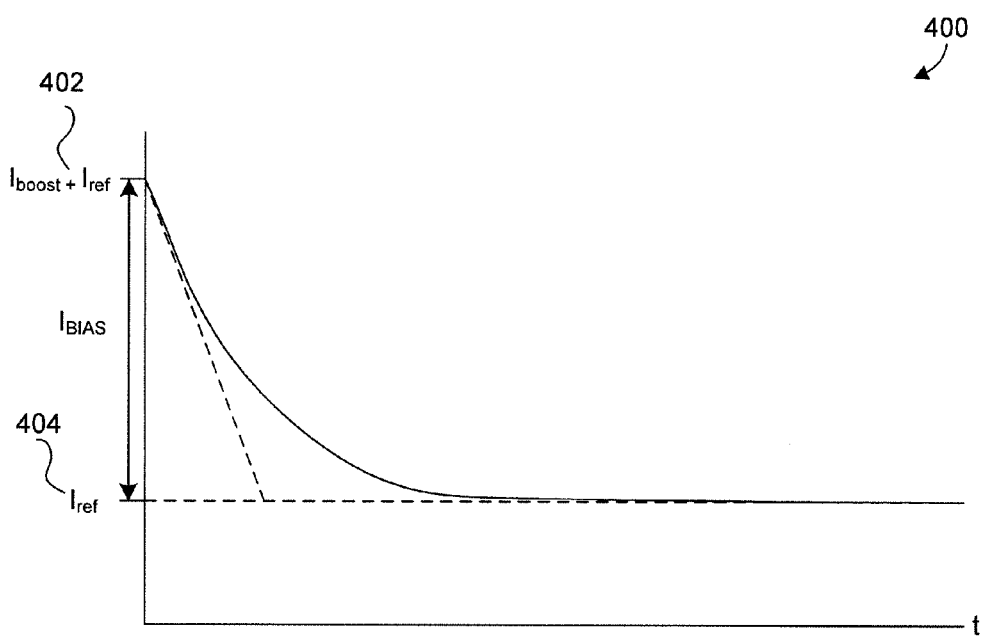
FIG. 4 is a graphical representation of bias current over time, according to aspects of the disclosure.

FIG. 4 is a graphical representation of the bias current over time 400 as it peaks to a value of the sum of the output boost current and the static reference current 402, then decays to a value of the static reference current 404. Referring again to the power gain of the power amplifier, the second amount of power gain provided by the power amplifier during a second time period after the power amplifier is powered on is determined by the exponential decay of the output bias current toward the value of the static reference current during the second time period. In some examples, the second time period begins when the second amount of power gain has reduced to a value acceptably close to the steady state amount of power gain. The first amount of power gain of the power amplifier is measured from the beginning of the first time period. The time constant can be defined as the amount of time between the initial powering on of the power amplifier (thus starting the first time period) and the time when the magnitude of the power gain of the power amplifier is close enough to its steady state value to induce an acceptably small error to the output signal. The power gain of the power amplifier is proportional to the exponential decay of the output bias current, as depicted in FIG. 4.

Figure 5:
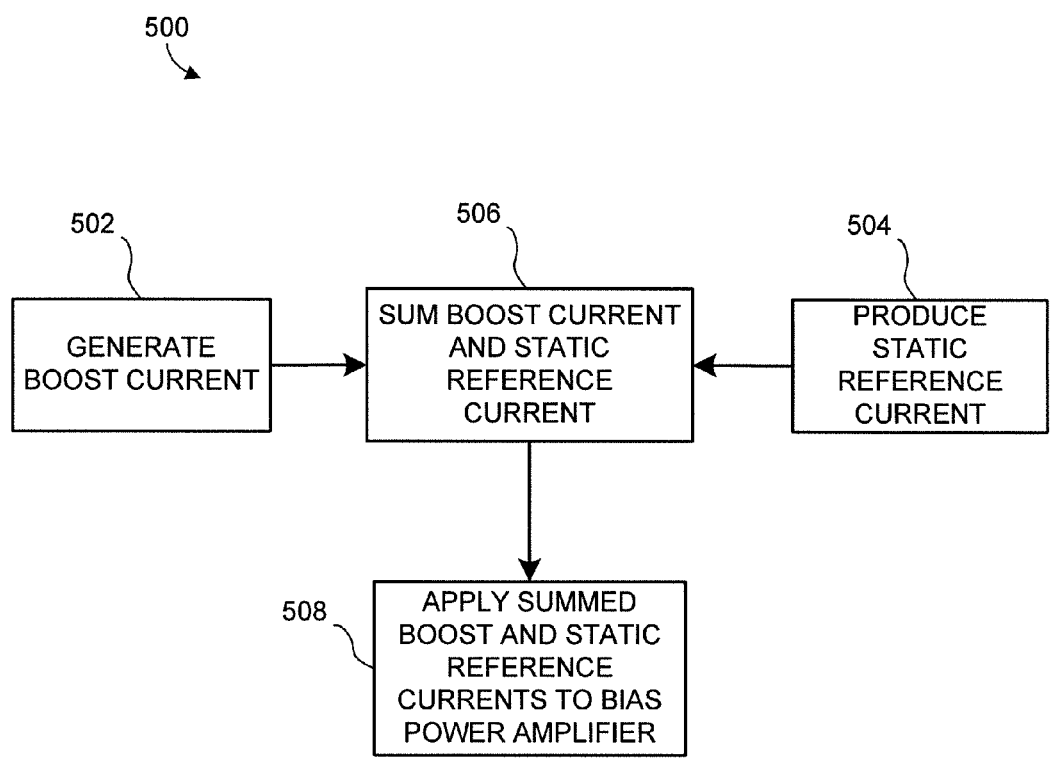
FIG. 5 shows steps in a method of correcting for a start-up transient in a power amplifier, in accordance with aspects of the disclosure.

Referring now to FIG. 5, steps in a method 500 for correcting for a start-up transient in a power amplifier are shown. The steps include producing a boost current that has a decay characteristic 502, producing a static reference current 504, summing the boost current and the static reference current 506, and applying the summed boost current and the static reference current to bias a power amplifier 508. As discussed above, the power amplifier provides a first amount of power gain during a first time period after the power amplifier is powered on and a second amount of power gain during a second time period subsequent to the first time period after the power amplifier is powered on. The first amount of power gain is responsive to the sum of the boost current and the static reference current and the second amount of power gain is determined by the decay of the summed boost current to a value of the static reference current.

FIGS. 6-10 show another example integrated start-up bias boost circuit for correcting circuit 600. Similar to the correcting circuit 100 shown in FIGS. 1-5 and discussed above, the correcting circuit 600 corrects for start-up transients inherent in power amplifiers by separating the circuit elements used to set the delay from those circuit elements used to set the output magnitude of the bias current and the characteristics of the output signal of the power amplifier. However, the correcting circuit 600 shown in FIGS. 6-10 can also include two scaling operations. Both the supply voltage of the power amplifier and the $RF_{OUT}$ or power level input of the power amplifier affect the magnitude of the thermal event that occurs when the power amplifier turns on. Because the magnitude of the thermal event is affected, the amount of boost current required also changes.

The varying levels of boost current required because of the effects of the supply voltage on the power amplifier can be corrected by scaling the original boost current by a scaling factor. The scaling factor is proportional to the power amplifier's supply voltage ($V_{PA}$). The varying levels of boost current that are required due to the effect of the RF drive on the power amplifier is handled by further scaling the original boost current by a scaling factor that is proportional to the magnitude of the RF signal, $RF_{OUT}$.

Figure 6:
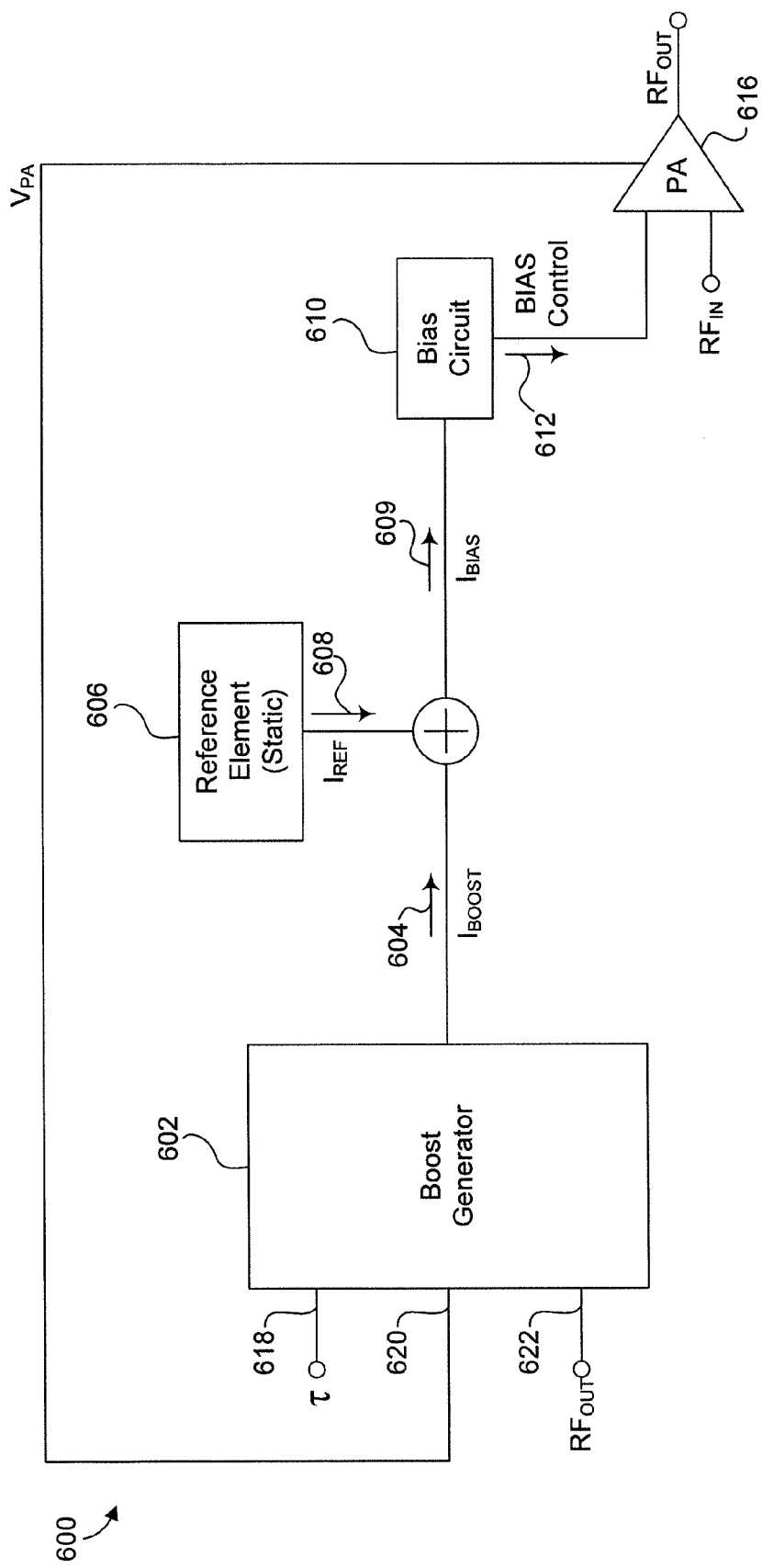
FIG. 6 is a block diagram that corresponds to another embodiment of an integrated start-up bias boost circuit for a power amplifier.

By adjusting the magnitude of $I_{BOOST}$ by the scaling factor that is based on the $RF_{OUT}$ and the $V_{PA}$, the correcting circuit 600 achieves dynamic scaling of $I_{BOOST}$. FIG. 6 is a block diagram of an example correcting circuit 600 that includes scaling of $I_{BOOST}$ based on $RF_{OUT}$ and the $V_{PA}$. The correcting circuit 600 includes a boost generator 602, a reference element 606, a bias element or bias circuit 610, and a power amplifier 616. The boost generator includes three inputs: a time constant 618, $V_{PA}$ 620, and $RF_{OUT}$ 622, which in combination adjust the $I_{BOOST}$ 604 output by the boost generator 602 based on values associated with the power amplifier 616. Because the values associated with the power amplifier 616 change during the transient period when the power amplifier is turned on, the boost generator corrects for the thermal event of the turn on by scaling $I_{BOOST}$ to adjust based on the changing supply voltage and output power values of the power amplifier.

Similar to the correcting circuit 100 described above, the correcting circuit 600 shown in FIG. 6 has a reference element 606 that provides a reference current ($I_{REF}$) 608. Currents $I_{BOOST}$ and $I_{REF}$ are summed to produce an output bias current, $I_{BIAS}$, 609 that is received as input to the bias circuit 610. The bias circuit 610 produces a bias control output 612 that is based on $I_{BIAS}$ 609. The power amplifier 616 is responsive to the bias control output 612 and is arranged to provide an amplified power output.

Figure 7:
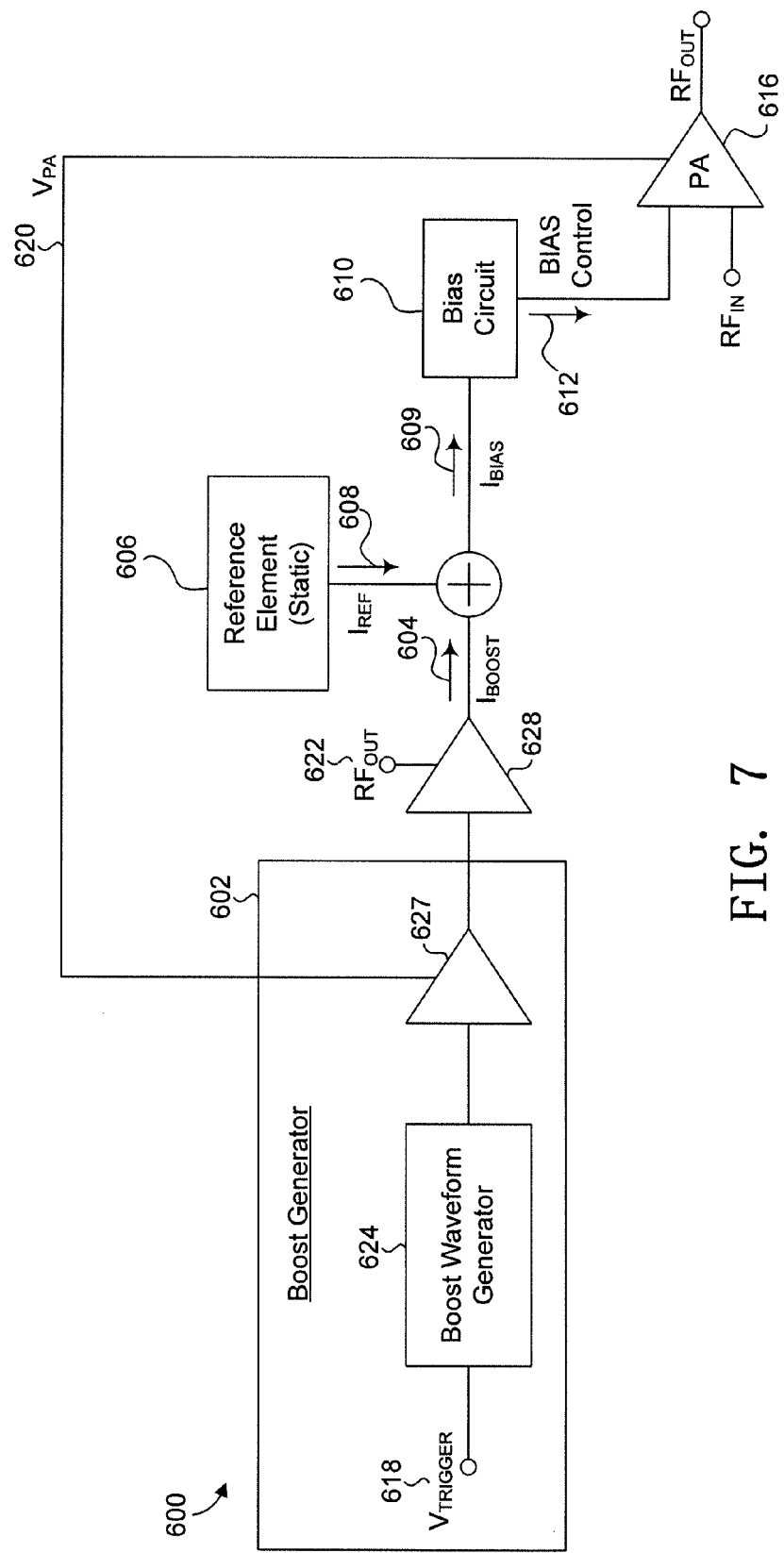
FIG. 7 is another block diagram corresponding to some elements of the boost generator of FIG. 6.

FIG. 7 shows another block diagram of the correcting circuit 600 with a more detailed illustration of scaling $I_{BOOST}$ 604. The boost generator 602 includes the trigger voltage ($V_{trigger}$) input 618 that is provided as input to the boost waveform generator 624. The output of the boost waveform generator 624 is input to an amplifier 627 with $V_{PA}$ 620 as its gain control input. The amplifier 627 with $V_{PA}$ 620 as its input adjusts the output $I_{BOOST}$ by a scaling factor that is based on $V_{PA}$. The output of amplifier 627 is input to a second amplifier 628 with $RF_{OUT}$ of the power amplifier 616 as its gain control input. The amplifier 627 further adjusts the output $I_{BOOST}$ 604 from the boost generator 602 by a scaling factor that is based on $RF_{OUT}$ 622 of the power amplifier 627. The output of the $V_{PA}$ and $RF_{OUT}$ scaled $I_{BOOST}$ is then summed with $I_{REF}$, as described above.

Figure 8:
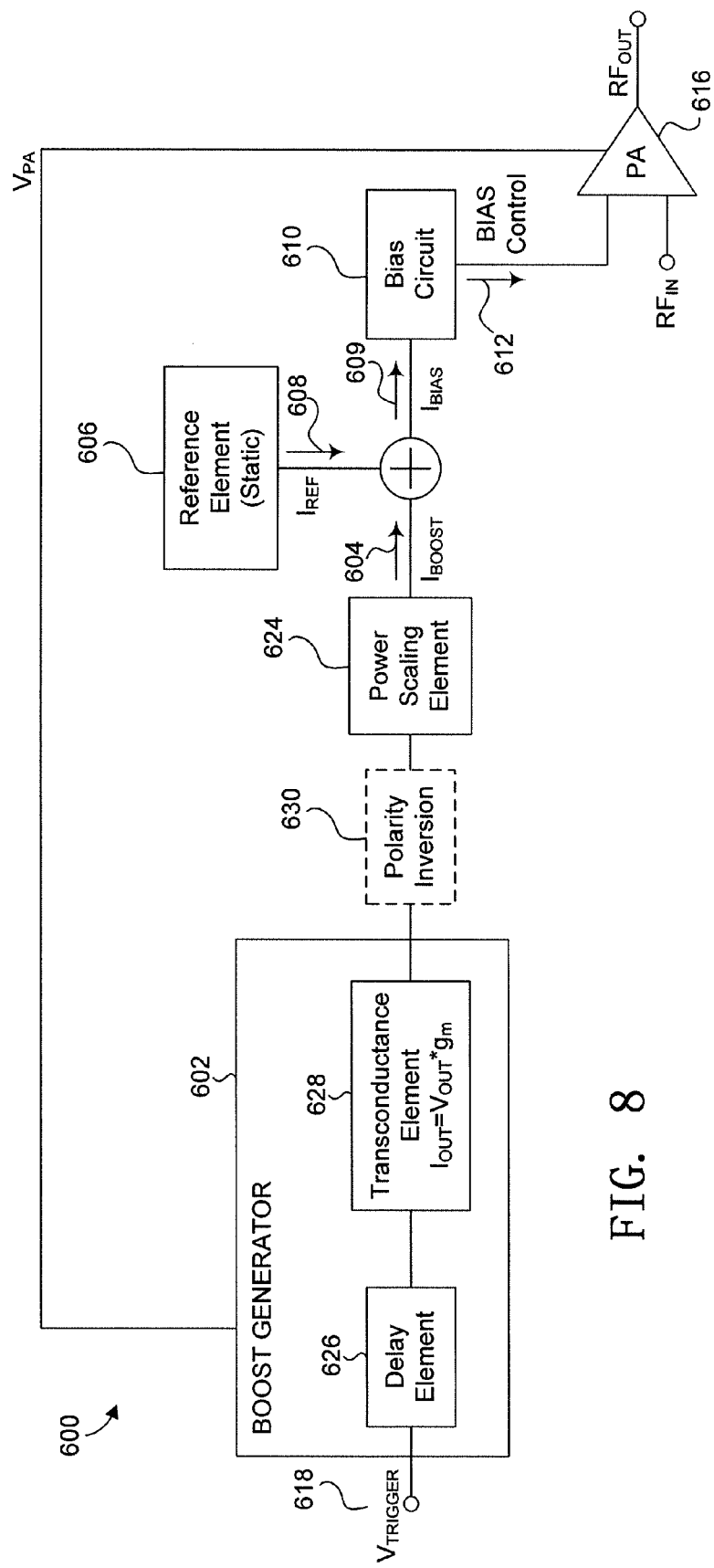
FIG. 8 is yet another block diagram that corresponds to some additional and optional elements of the integrated start-up bias boost circuit shown in FIG. 6.

FIG. 8 shows yet another block diagram of the correcting circuit 600 that adjust $I_{BOOST}$ by a scaling factor that is based on $V_{PA}$ and $RF_{OUT}$. As discussed above, the boost generator 602 can include a delay element 626 and a transconductance element 628. However, different from the example correcting circuit 100 discussed above, the correcting circuit 600 that scales $I_{BOOST}$ includes a transconductance element 628 in which the output current is based on the delay waveform signal and the magnitude of the output voltage of the delay element 626 is proportional to $V_{PA}$.

The output current, $I_{BOOST}$, of the boost generator is input to an optional polarity inverter 630 in a manner similar to the polarity inverter discussed above in FIG. 2. The output of the polarity inverter 630 is a current input to a power scaling element 624. The output current of the power scaling element 624 is scaled $I_{BOOST}$, which is adjusted by a scaling factor that is proportional to the output power of the power amplifier As discussed above, $I_{BOOST}$ is summed with $I_{REF}$ to produce $I_{BIAS}$ 609, which is input to the bias circuit 610. The output of the bias circuit is bias control 612 which is an input to the power amplifier 616.

Figure 9:
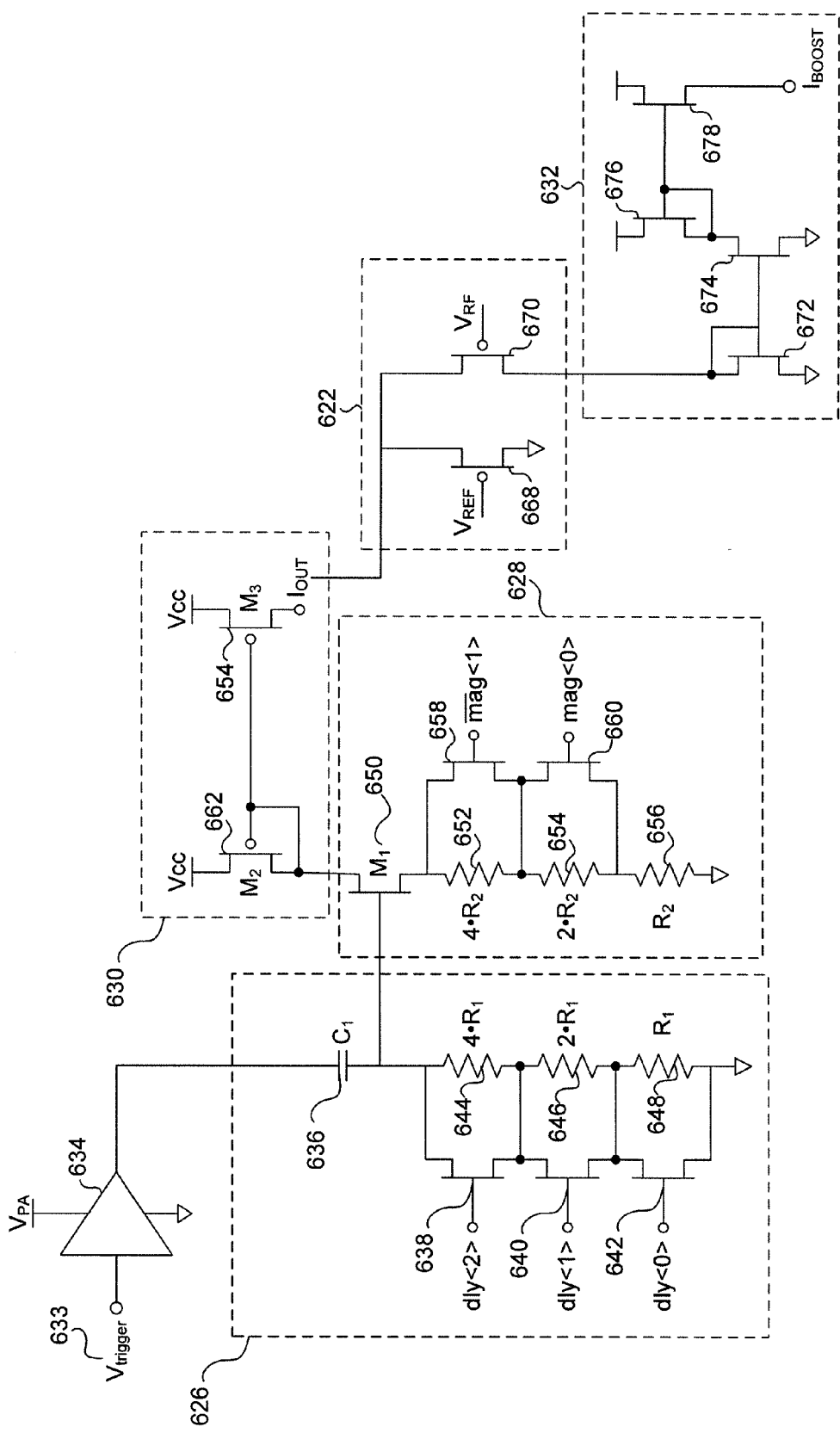
FIG. 9 is an example schematic of the integrated start-up bias boost circuit shown in FIG. 8.

FIG. 9 is an example schematic showing a delay element 626, a transconductance element 628, a polarity inversion circuit 630, a power scaling element 622, and a polarity and gain element 632. Similar to the correcting circuit 100 described in FIG. 3A, the delay element 626 can be a resistor-capacitor (RC) charge circuit in which a capacitor 636 begins to charge when the trigger voltage input ($V_{trigger}$) 633 transitions from low (0V) to high. $V_{trigger}$ 633 is input to an amplifier 634 that also receives input from $V_{PA}$, thereby adjusting the ultimate $I_{BOOST}$ based on $V_{PA}$. A combination of delay switches 638, 640, 642 are closed to select one of delays d0, d1, d2, d3, d4, d5, d6, and d7. Simple switches or other circuit elements can also be used. The delay element 626 includes a capacitor 636 and a series of digitally controllable resistors 644, 646, 648 that are electrically coupled to each other in series. Any suitable adjustable delay can be used. By controlling the resistance value of the delay element 626, the delay waveform signal's response to the input voltage signal received by the delay element 626 can also be controlled.

The output voltage signal of the delay element 626 is received at the input of the transconductance element 628. The transconductance element 628 includes an amplifying device 650 or transistor and a series of resistors 652, 654, 656 electrically coupled together in series. In the example transconductance element shown in FIG. 9, the amplifying device 650 is a FET, for example, or can be any other suitable type of amplifying device. The resistors 652, 654, 656 are a series of three digitally selectable resistors electrically coupled together in series. Resistors 652, 654, 656 are digitally controlled by two switches 658, 660 that vary the resistance and thus the output boost current that is output from the transconductance element 628.

The output boost current of the transconductance element 628 is received as input to the polarity inversion circuit 630 shown in FIG. 9. The polarity inversion circuit 630 includes two MOSFETs 662, 664, in this example, that are electrically coupled in series to each other. The polarity inversion circuit 630 generates a mirrored output boost current that is greater than, but directly proportional to the boost current output by the transconductance element 628.

The output boost current of the polarity inversion circuit 630 is received as input to the power scaling element 622. The power scaling element 622 includes two parallel MOSFETs 668, 670. MOSFET 668 has a reference voltage input ($V_{REF}$) and MOSFET 670 has a reference voltage ($V_{REF}$) and a voltage proportional to the RF power level of the power amplifier ($V_{RF}$). Both $V_{REF}$ and $V_{RF}$ are supplied by a power detector (not shown) that is located elsewhere on the die from the power amplifier and the correcting circuit described herein. $V_{REF}$ is a reference voltage from the power detector and $V_{RF}$ is a signal such that $V_{RF}-V_{REF}$ is proportional to the RF power level of the disclosed power amplifier. The output of power scaling circuit 622 can be taken from either device 668 or 670 depending on the polarity of scaling desired.

The output of the power scaling element 622 is received as input to an optional polarity and gain element 632. The polarity and gain element 632 includes a gain portion that includes two MOSFETs 672, 674 electrically coupled in series with each other. The polarity and gain element 632 also includes a polarity inversion circuit portion in series with the gain portion. The polarity inversion circuit portion includes two MOSFETs electrically coupled in series with each other 676, 678. The output of the polarity and gain element 632 is $I_{BOOST}$, adjusted so it is scaled to $RF_{OUT}$ and $V_{PA}$.

Figure 10:
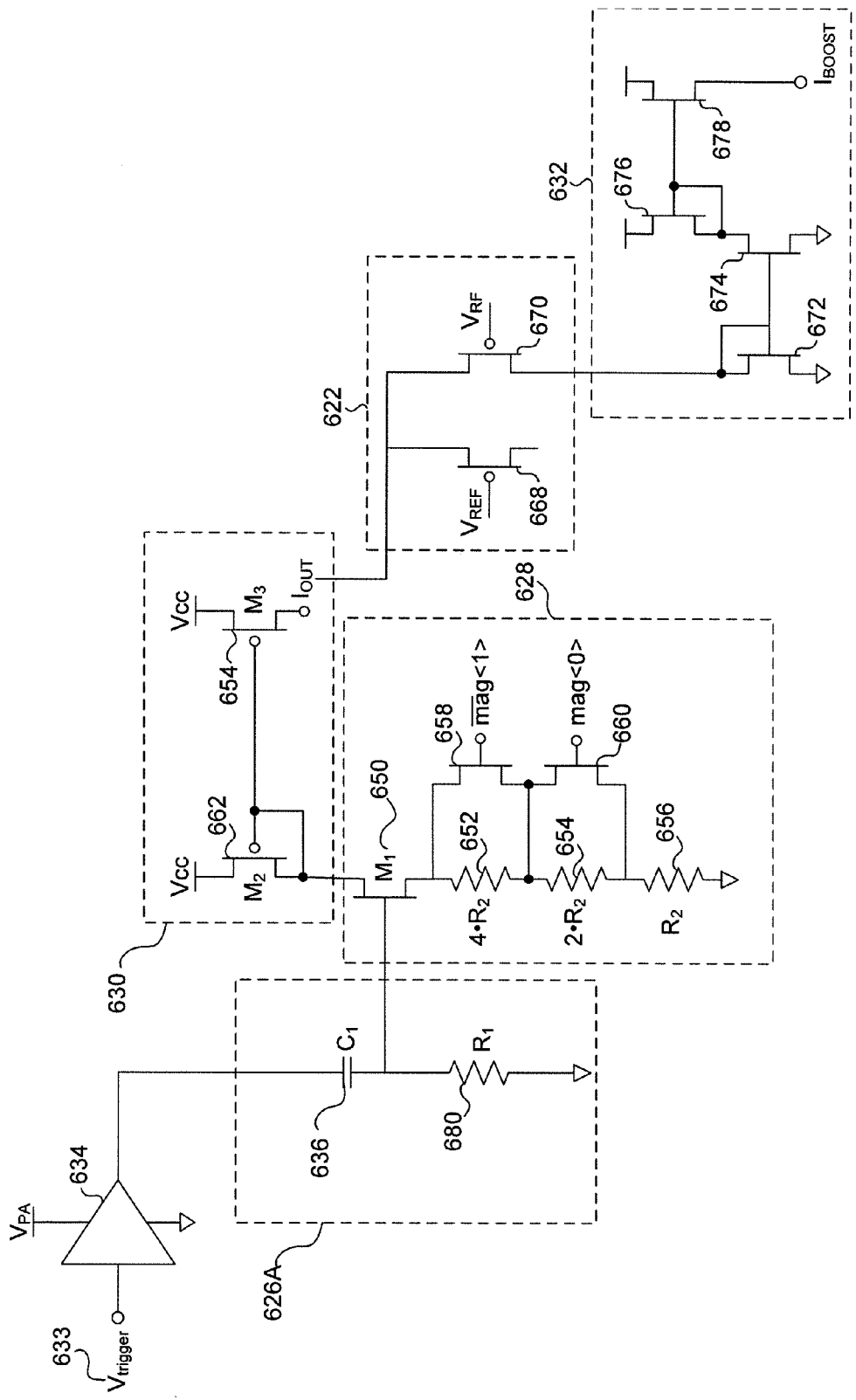
FIG. 10 is another example schematic of the integrated start-up bias boost circuit shown in FIG. 8.

FIG. 10 is another correcting circuit that scales $I_{BOOST}$ based on $V_{PA}$ and $RF_{OUT}$. Instead of a selectable delay 626 that includes the delay switches 638, 640, 642 and the resistors 644, 646, 648 shown in FIG. 9, the correcting circuit 600 in FIG. 10 includes delay 626A having a single resistor 680. Alternatively, the delay element could be a series of resistors or any other suitable resistance element(s).

The above described methods and systems for correcting for start-up transients in power amplifiers can be implemented in various methods of operating and systems encompassing wireless local area network (WLAN) devices that include power amplifiers. Such WLAN power amplifiers experience start-up transients when the power amplifiers are powered on, as described above. Generally, WLAN power amplifiers, such as power amplifiers in WiFi devices, operate in burst mode and are powered on every time a packet of data is transmitted or received. The correction for the power amplifiers' start-up transients typically occurs when the power amplifiers are powered on, which in WiFi devices is at each packet transmission.

WLAN devices, and more specifically WiFi devices, can operate at multiple power levels depending on the type of desired data transmission. For example, WiFi Direct and personal hotspot data transmission usually occurs between devices that are physically located in relatively close proximity to each other so transmitted data travels a shorter distance than in a general WiFi system over which data is required to travel a farther distance. Thus, the power required to transmit and receive data in a WiFi Direct, personal hotspot, or other close proximity data transmission systems is lower than the power required to transmit and receive data being transmitted longer distances, such as in a WiFi system with a greater data transmission range. For power efficiency, the transmitting and receiving power amplifiers in WLAN systems can operate at a respective low power level and a high power level, depending on the type of data transmission or receipt that is occurring. The embodiments herein are described as having two distinct power levels, however disclosed embodiments are not intended to be limiting in any way, and three or more power levels may be provided without exceeding the scope of this disclosure.

Generally, WLAN standards require that the output power of power amplifiers in WLAN systems remain constant over the duration of the burst when the power amplifiers are powered on. To maintain a constant output power to the WLAN system power amplifiers, the gain of the power amplifiers must remain the same throughout the burst as well. The above-described methods and systems for correcting for the powering on start-up transients of the WLAN system power amplifiers correct for the thermal effects that inherently occur when WLAN power amplifiers are powered on.

The above-described systems and methods of correcting for power amplifier start-up transients in WLAN systems are different when the power amplifier is operated at a low power level compared to a high power level based on the type of control signal received by the power amplifier. The control signal can result in the application of a supply voltage to the power amplifier at the high power level, such as 3.6V in some examples. In some embodiments, in addition to modifying the start-up transient correction when the power amplifier operates in low power mode, the power amplifier supply voltage is also reduced, such as to 1.8V or half of the high power level supply voltage. The lower supply voltage can be used to further reduce power amplifier power consumption.

Figure 11:
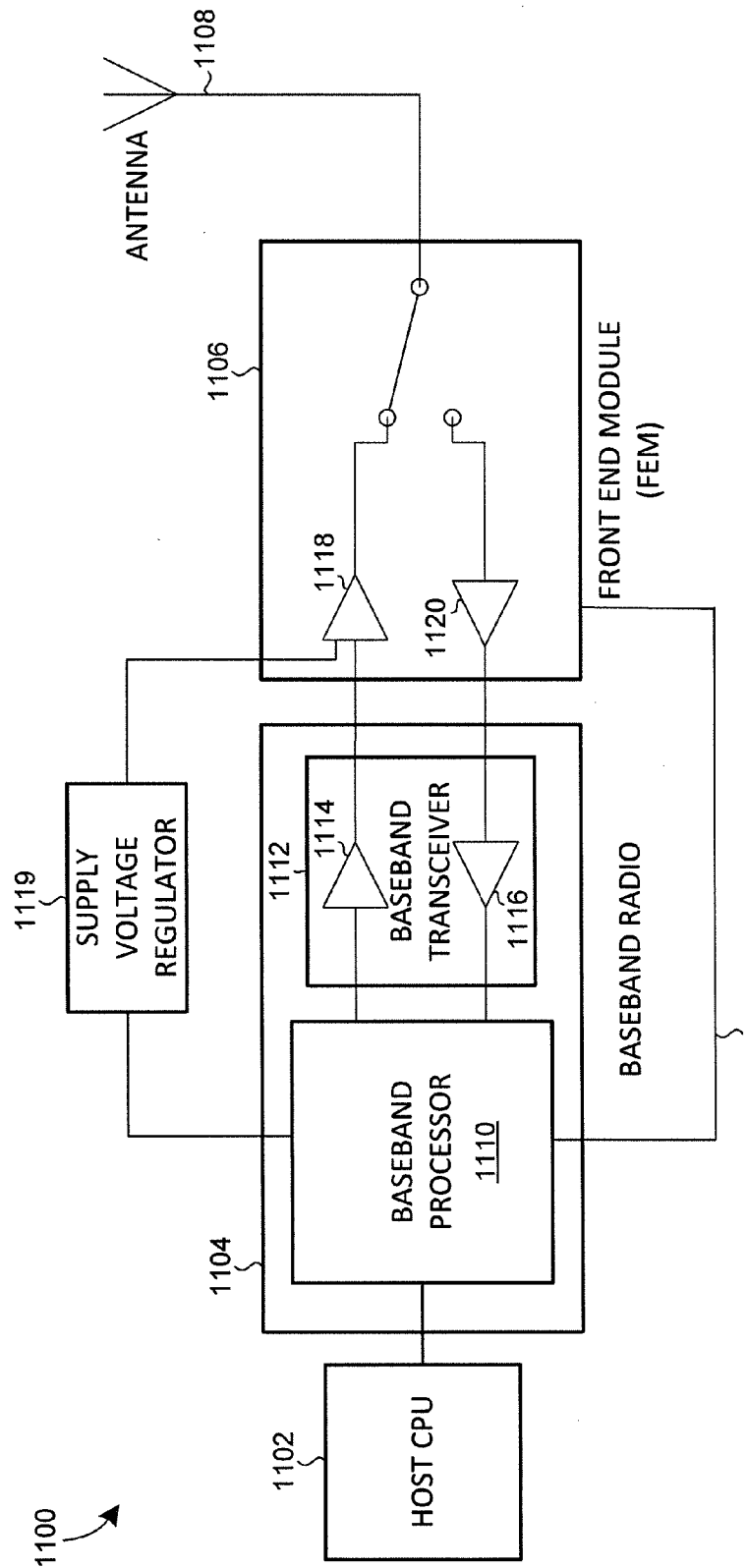
FIG. 11 is a block diagram showing elements of an example wireless local area network device that includes a power amplifier.

Data is transmitted and/or received by a WLAN system 1100, such as the system shown in the block diagram of FIG. 11. The WLAN system 1100 of FIG. 11 shows a host CPU 1102, a baseband radio 1104, a front end module (FEM) 1106, and an antenna 1108. The host CPU 1102 generates the data signal to be transmitted or ultimately receives the data transmitted from/to the WLAN system 1100. The baseband radio 1104 includes a baseband processor 1110 and a baseband transceiver 1112 having two amplifiers 1114, 1116. The baseband processor 1110 and transceiver 1112 implement the WLAN system's 1100 real-time radio transmissions of the data signal transmitted from or received by the to host CPU 1102. The FEM 1106 includes a low noise amplifier 1120 and the power amplifier 1118 that receives the data signal from the baseband radio 1104 and amplifies the signal's power for the signal transmission through the antenna 1108. The FEM's power amplifier 1118 is powered on every time a "burst" or data signal transmission request or receipt occurs. The FEM power amplifier 1118 is not powered on between bursts.

The FEM power amplifier 1118 is powered on responsive to a received control signal 1117 from the baseband radio 1104. The control signal 1117 originates in the baseband processor 1110. The baseband processor 1110 can include instructions on whether the FEM is to operate in receive mode (in which case the low noise amplifier 1120 is enabled) or in transmit mode (in which case the power amplifier 1118 is enabled). When the FEM is instructed to operate in transmit mode, the control signal 1117 may also indicate whether the FEM power amplifier 1118 is to transmit at a low power level or a high power level.

The low power level operation of the FEM power amplifier 1118 is associated with either a high power level supply voltage, which can be 3.6V in some examples, or a low power level supply voltage, which can be 1.8V in some examples. The high power level operation of the FEM power amplifier is associated with a high power level supply voltage, which can be 3.6V in some examples. The baseband radio 1104 can have a dedicated control pin that instructs the FEM power amplifier 1118 to operate at the low power level. The baseband radio 1104 also instructs a supply voltage regulator 1119, such as an external power management integrated circuit (PMIC) or programmable low dropout regulator (LDO), to apply the appropriate supply voltage to the FEM, thus setting power level operation of the FEM power amplifier 1118.

Figure 12:
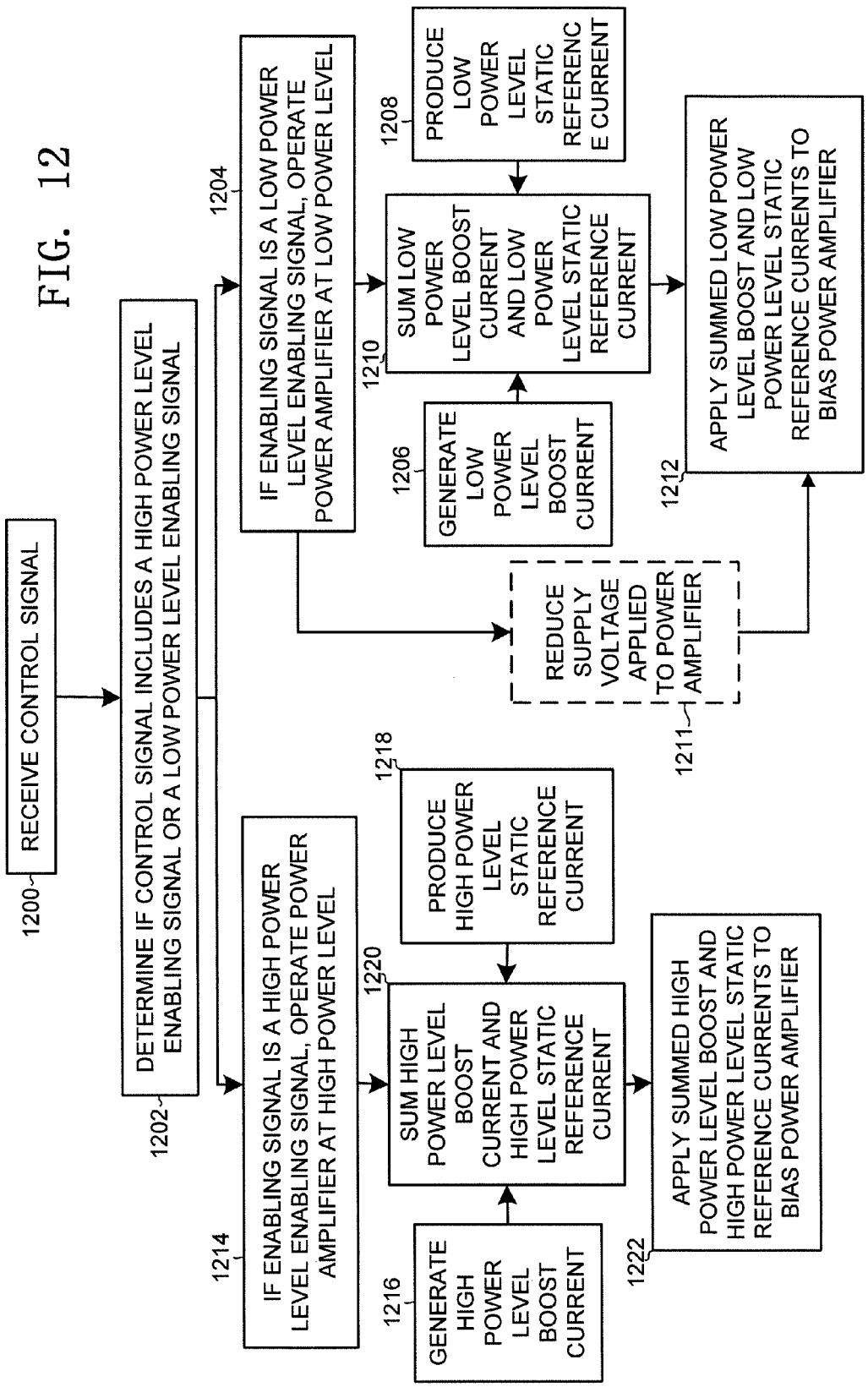
FIG. 12 shows steps in a method of operating the power amplifier of FIG. 11 in a high power mode and a low power mode.

The FEM power amplifier receives a control signal 1117, as shown at 1200 and determines whether the control signal includes a high power level enabling signal or a low power level enabling signal, as shown at 1202 in the flow diagram of FIG. 12. If the control signal indicates that the FEM power amplifier is to operate at the low power level when the FEM power amplifier is powered on as shown at 1204, i.e. supply voltage regulator 1119 of FIG. 11 is set to a low power level supply voltage, the correction for the start-up transients is applied in a customized fashion for the low power level and a low power level boost current is generated 1206. The low power level boost current can be generated based on the value of the low power level or could be set to a predetermined low power level boost current value.

Further, a low power level static reference current is produced at 1208. Similar to the low power level boost current, the low power level static reference current can be based on the low power level value or could be set to a predetermined low power level static reference current value, depending on the embodiment. Regardless of how the low power level boost current and the low power level static reference current are generated or produced, the low power level boost current and the low power level static reference current are then summed, as shown at 1210. The summed low power level boost current and the low power level static reference current are applied to bias the FEM power amplifier for operation at the low power level, as shown 1212. The summed low power level boost current and the low power level static reference current are also referred to as the bias current that is applied to the FEM power amplifier, as discussed above in reference to FIGS. 4 and 6.

Optionally, the supply voltage applied to the power amplifier can be reduced, in some examples, as shown at 1211 when a control signal is determined to have a low power mode enabling signal. Either a low power level supply voltage or a high power level supply voltage can be applied to the power amplifier when the control signal is determined to have a low power level enabling signal, depending on the embodiment. However, a high power level supply voltage is applied to the power amplifier when the power amplifier operates at the high power level.

The values of the bias current (the summed boost current and static reference current) needed to properly correct for the powering on start-up transients for operation of the FEM power amplifier at the low power level differs from the values of the bias needed to properly correct for the powering on start-up transients for operation of the FEM power amplifier at the high power level. In the methods and systems of correcting for start-up transients in power amplifiers described above in regards to FIGS. 1-10, the amplitude of the generated boost current is summed with the static reference current at the beginning of the burst of powering on the FEM power amplifier, which biases the FEM power amplifier so that their output power during the start-up transient period of time closely matches the power output of the FEM power amplifier after it thermally stabilizes. The boost for maintaining a consistent FEM power amplifier output power differs when the FEM power amplifier operates at a low power level (e.g., 1.8V supply voltage and/or low power level static reference current) compared to a high power level (e.g., 3.6V supply voltage and/or high power static reference current).

FIG. 12 also shows the operation of the FEM power amplifier when it receives a control signal that indicates that the FEM power amplifier is to operate at the high power level, as shown by 1214, i.e. supply voltage regulator 1119 is set to a high power level supply voltage. In a similar fashion with the low power level operation, the high power level operation also generates a boost current, as shown at 1216. However, the generated boost current for the high power level FEM power amplifier operation is greater than the generated boost current for the low power level FEM power amplifier operation. The high power level boost current can be generated based on the value of the high power level or could be set to a predetermined high power level boost current value. Further, a high power level static reference current is produced, as indicated by 1218, which is greater than the low power level static reference current, and can be based on the high power level value or could be a predetermined high power level static reference current value. The high power level boost current and the high power level static reference current are summed at 1220 and the summed current is applied to bias the FEM power amplifier for operation at the high power level, as shown at 1222.

In some examples, multiple power levels can be used, if desired. The changes in the biasing of the FEM power amplifier for different power levels can be made in conjunction with other changes to the operation of the FEM power amplifier, if desired, such as adjusting the supply voltage applied to the FEM power amplifier (e.g., reducing the applied supply voltage to the power amplifier as described above), adjusting the decay time for the boost current, and/or adjusting a load applied to the FEM power amplifier. Any combination of the changes to the correction for the FEM power amplifier start-up transients, as discussed above in reference to FIGS. 1-10, can be applied to the FEM power amplifier that that is shown in the example system of FIG. 11. Changing the supply voltage to the FEM power amplifier alone causes a changing thermal loading on the FEM power amplifier which thermal loading changes the dynamic behavior of the signal transmission abilities of the FEM power amplifier. Thus, reducing the supply voltage alone does not thermally stabilize the FEM power amplifier and additional correction is needed to achieve a consistent output power for the FEM power amplifier, as described above.

The methods and systems for correcting for the start-up transients in the FEM power amplifier when operating at a low power level can include scaling operations. The scaling operations can apply one or more scaling factors to the FEM power amplifier and/or the boost current (and thus the input power), as described above, in regards to the above discussed scaling of the boost current in to FIGS. 6-10. The scaling factors discussed above can be adjusted to properly scale the boost current based on the power level at which the FEM power amplifier is to operate. The scaling factors are determined based on the supply voltage applied to the FEM power amplifier by the supply voltage regulator 1119 and controlled by the baseband radio processor 1110 and/or the input power of the FEM power amplifier.

A low power level scaling factor can be applied to correct for the start-up transients in the FEM power amplifier when it operates at the low power level. The low power level scaling factor can be based on the low power level supply voltage to the FEM power amplifier and may be proportional to the supply voltage of the FEM power amplifier, in some examples. The low power level scaling factor can include a low power level voltage scaling factor that adjusts the supply voltage of the FEM power amplifier and a low power level power scaling factor that adjusts the input power to the FEM power amplifier by adjusting the boost current applied to the FEM power amplifier.

Similar sets of scaling factors also can be applied to the methods and systems for correcting for the start-up transients in the FEM power amplifier when it operates at the high power level, except that the scaling factors are adjusted for the high power level operation rather than the low power level operation of the FEM power amplifier. Example scaling operations are described above in greater detail in reference to FIGS. 6-10 and are based on the input power (through the boost current) and the supply voltage to the FEM power amplifier. The scaling operations can be applied to the FEM power amplifier shown in FIG. 11.

Figure 13:
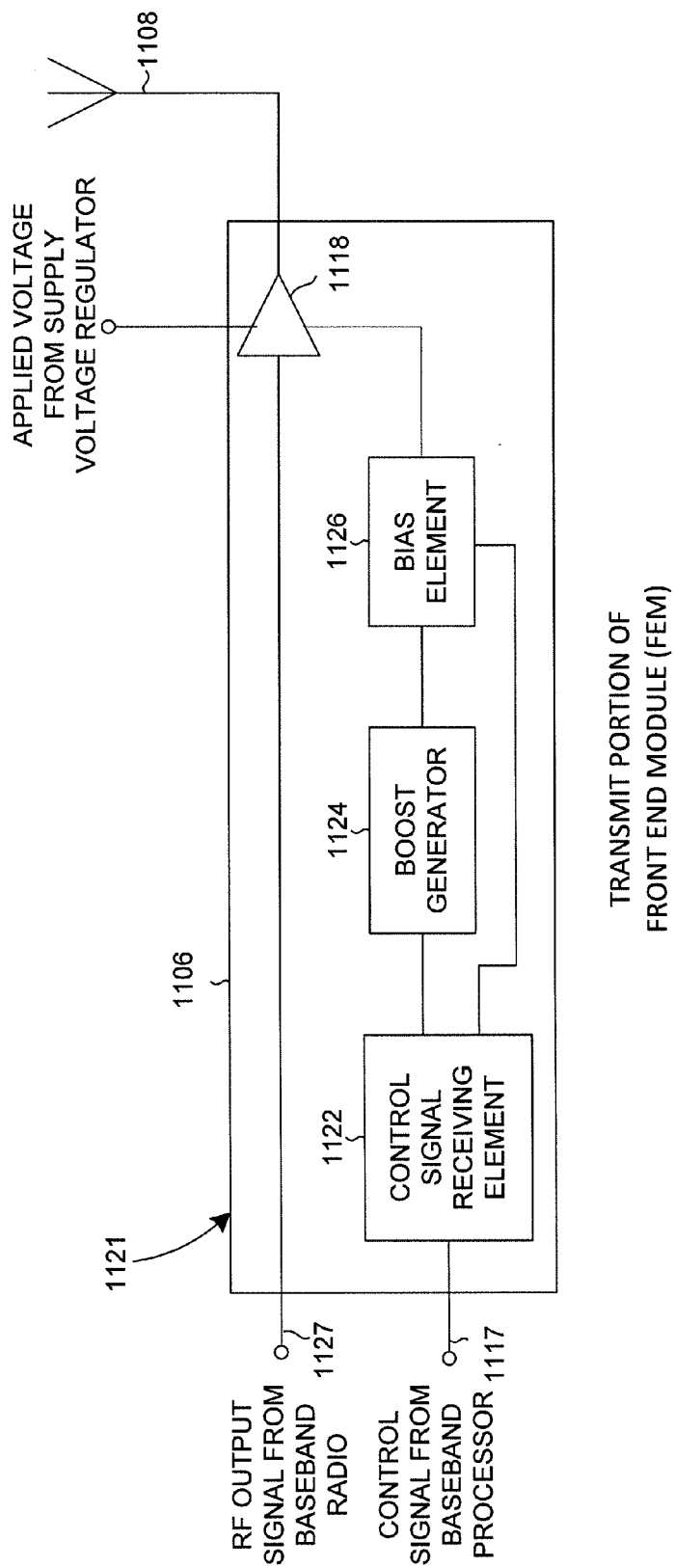
FIG. 13 is a block diagram of example circuit elements of the transmit portion of a front end module in a wireless local area network device.

A circuit 1121 can correct for the start-up transients in the FEM power amplifier 1118 as shown in FIG. 13. As discussed above, the FEM power amplifier 1118 shown in FIGS. 11 and 13 is part of a WLAN device and can operate both at a low power level and a high power level. The circuit 1121 can be included in the FEM 1106 and controls the operation of the power amplifier 1118. The circuit could also be part of the FEM power amplifier itself, in alternative examples.

FIG. 13 shows a block diagram of the circuit elements in the FEM 1106 that transmits signals from the baseband radio 1104. The circuit includes a control signal receiving element 1122, a boost generator 1124, a bias element 1126, and the FEM power amplifier 1118. The control signal receiving element 1122 is arranged to receive a control signal 1117 from a baseband processor of the WLAN, such as the baseband radio 1104 shown in FIG. 11. The control signal receiving element 1122 is also arranged to determine if the control signal 1117 includes a high power level enabling signal or a low power level enabling signal. The high power level enabling signal signals the voltage regulator 1119 of FIG. 11 to apply a high power level supply voltage to the power amplifier 1118 and the low power level enabling signal signals the voltage regulator 1119 of FIG. 11 to apply a low power level supply voltage to the power amplifier 1118.

The boost generator 1124 of the FEM 1106 is arranged to provide a high power level output boost current if the control signal receiving element 1122 determines that the control signal 1117 includes a high power level enabling signal. The boost generator 1124 is also arranged to provide a low power level output boost current if the control signal receiving element determines that the control signal 1117 includes a low power level enabling signal. The bias element 1126 has an input that is arranged to receive the high power level boost current or the low power level boost current from the boost generator 1124, depending on whether the control signal includes a high power level enabling signal or a low power level enabling signal, respectively. The bias element 1126 further receives a signal from control signal receiving element 1122 indicative as to whether a high power level enabling signal or a low power level enabling signal has been received. The bias element 1126 is also arranged to provide a high power level bias current and add the high power level bias current to the high power level boost current responsive to the signal from control signal receiving element 1122 or a low power level bias current and add the low power level bias current to the low power level boost current responsive to the signal from control signal receiving element 1122.

The FEM power amplifier 1118 amplifies the RF signal 1127 from the baseband radio and is responsive to the output of the bias element 1126, which is alternately a high power output that includes a high power level boost current from the boost generator 1124 combined with a high power level bias current, or a low power output that includes a low power level boost current from the boost generator 1124 combined with a low power level bias current. The FEM power amplifier 1118 is arranged to provide an amplified high power level power output responsive to a high power output of bias element 1126 and an amplified low power level power output responsive to a low power output of bias element 1126.

In response to the high power output of bias element 1126, the power amplifier 1118 provides a high power level first amount of power gain during a first time period after the power amplifier 1118 is powered on with the high power level enabling signal provided from the control signal receiving element 1122. The high power level first amount of power gain is responsive to the sum of the high power level boost current and the high power level static reference current from the bias element 1126. During a second time period after the power amplifier 1118 is powered on at the high power level, the power amplifier 1118 provides a second amount of power gain. The second time period follows the first time period. The high power level second amount of power gain is determined by decay of the high power level output bias current (the summed high power level boost current and high power level static reference current) to a value of the high power level static reference current.

The boost generator 1124 and the bias element 1126 operate differently depending on the state of control signal 1117 received from the baseband radio 1104 and the applied supply voltage from the voltage regulator 1119, which are preferably controlled in concert by baseband processor 1110. Boost generator 1124 in combination with bias element 1126 provides a boost characteristic customized to the supply voltage value output by supply voltage regulator 1119. As described above in relation to FIG. 11, the supply voltage value is controlled in concert with whether the control signal 1117 output by the baseband radio 1104 is reflective of a high power level enabling signal or a low power level enabling signal.

In response to the low power level boost control output, the power amplifier provides a low power level first amount of power gain during a first time period after the power amplifier 1118 is powered on with the low power level enabling signal. The low power level first amount of power gain is responsive to the sum of the low power level boost current and the low power level static reference current (the bias current that is applied to the FEM power amplifier). During a second time period after the power amplifier 1118 is powered on at the low power level, the power amplifier 1118 provides a second amount of power gain. The second time period follows the first time period. The low power level second amount of power gain is determined by decay of the low power level output bias current to a value of the low power level static reference current (the sum of the low power level boost current and the low power level static reference current).

The disclosed methods and systems for correcting for the start-up transients in power amplifier that operate at multiple power levels are explained with example power amplifiers in a programmable wireless system. Alternative methods and systems can include power amplifier in other systems or circuits, such as cellular devices or other systems that transmit data in which power amplifier are powered on and experience start-up transients.

Having described and illustrated the principles of the invention in a preferred embodiment thereof, it should be apparent that the invention can be modified in arrangement and detail without departing from such principles. We claim all modifications and variations coming within the spirit and scope of the following claims.

The invention claimed is:

1. A method for correcting for a start-up transient in a power amplifier in a wireless local area network device, the power amplifier being operational at a high power level and a low power level, comprising:
    in response to receiving a control signal that indicates that the power amplifier is to operate at the high power level, operating the power amplifier at the high power level;
    in response to receiving a control signal that indicates that the power amplifier is to operate at the low power level, operating the power amplifier at the low power level by:
        sending an instruction to a supply voltage regulator to apply a low supply voltage to the power amplifier;
        producing a low power level boost current having a low power level decay characteristic;
        producing a low power level static reference current;
        adjusting the low power level boost current by a low power level scaling factor;
        summing the low power level boost current and the low power level static reference current; and
        applying the summed low power level boost current and the low power level static reference current to bias the power amplifier for the low power level.

2. The method of claim 1, wherein operating the power amplifier at the high power level includes:
    producing a high power level boost current having a high power level decay characteristic;
    producing a high power level static reference current;
    adjusting the high power level boost current by a high power level scaling factor;
    summing the high power level boost current and the high power level static reference current; and
    applying the summed high power level boost current and the high power level static reference current to bias the power amplifier for the high power level.

3. The method of claim 1, wherein when the power amplifier operates at the low power level, the power amplifier provides a first amount of power gain during a first time period after the power amplifier is powered on, the first amount of power gain responsive to the sum of the low power level boost current and the low power level static reference current and a second amount of power gain during a second time period after the power amplifier is powered on, the second time period following the first time period, the second amount of power gain determined by decay of the summed low power level boost current to a value of the low power level static reference current.

4. The method of claim 3, wherein the decay of the low power level boost current begins when the control signal indicating that the power amplifier is to operate at the low power level is supplied to the power amplifier.

5. The method of claim 1, wherein the low power level scaling factor includes a low power level voltage scaling factor that adjusts the low power level supply voltage and a low power level power scaling factor that adjusts a low power level input power supplied to the power amplifier.

6. The method of claim 1, wherein when the power amplifier operates at the high power level, the power amplifier provides a first amount of power gain during a first time period after the power amplifier is powered on, the first amount of power gain responsive to the sum of the high power level boost current and the high power level static reference current and a second amount of power gain during a second time period after the power amplifier is powered on, the second time period following the first time period, the second amount of power gain determined by decay of the summed high power level boost current to a value of the high power level static reference current.

7. The method of claim 6, wherein the decay of the high power level boost current begins when the control signal indicating that the power amplifier is to operate at the high power level is supplied to the power amplifier.

8. The method of claim 1, wherein the high power level scaling factor includes a high power level voltage scaling factor that adjusts the high power level supply voltage and a high power level power scaling factor that adjusts a high power level input power supplied to the power amplifier.

9. The method of claim 1, wherein operating the power amplifier at the high power level includes applying a high power level supply voltage to the power amplifier.

10. The method of claim 1, wherein operating the power amplifier at the high power level includes instructing the supply voltage regulator to apply a high power level supply voltage to the power amplifier.

11. The method of claim 10, wherein operating the power amplifier at the low power level includes sending an instruction to the supply voltage regulator to reduce the supply voltage from the high power level supply voltage to the low power level supply voltage.

12. The method of claim 1, further comprising receiving the control signal that indicates that the power amplifier is to operate at the low power level at a control pin of a baseband radio that is dedicated to instructing the power amplifier to operate at the low power level.

13. A circuit that corrects for start-up transients in a power amplifier in a wireless local area network device, the power amplifier operational at a high power level and a low power level, the circuit comprising:
- a control signal receiving element arranged to receive a control signal from a baseband radio of the wireless local area network device and arranged to determine if the control signal includes a high power level enabling signal having a high power level supply voltage or a low power level enabling signal having a low power level supply voltage;
- a supply voltage regulator arranged to be set to a high power level supply voltage if the control signal includes the high power level enabling signal and also arranged to be set to a low power level supply voltage if the control signal includes the lower power level enabling signal;
- a boost generator arranged to provide a high power level output boost current if the control signal receiving element determines that the control signal includes a high power level enabling signal and to provide a low power level output boost current if the control signal receiving element determines that the control signal includes a low power level enabling signal;
- a bias element having an input that is arranged to receive the high power level boost current or the low power level boost current from the boost generator, the bias element arranged to provide a high power level boost control output in response to receiving the high power level boost current or to provide a low power level boost control output in response to receiving the low power level boost current; and
- a power amplifier responsive to high power level supply voltage and the high power level boost control output, the power amplifier also responsive to the low power level supply voltage and the low power level boost control output from the bias element, the power amplifier arranged to provide an amplified high power level power output if the high power level boost control output is applied to the power amplifier and an amplified low power level power output if the low power level boost control output is applied to the power amplifier, wherein the power amplifier:
- in response to the high power level boost control output, provides a high power level first amount of power gain during a first time period after the power amplifier is powered on with the high power level enabling signal, the high power level first amount of power gain responsive to the sum of the high power level boost current and the high power level static reference current, and a high power level second amount of power gain during a second time period after the power amplifier is powered on, the high power level second time period following the first time period, the high power level second amount of power gain determined by decay of the high power level output bias current to a value of the high power level static reference current; and

- in response to the low power level boost control output, provides a low power level first amount of power gain during a first time period after the power amplifier is powered on with the low power level enabling signal, the first amount of power gain responsive to the sum of the low power level boost current and the low power level static reference current, and a low power level second amount of power gain during a second time period after the power amplifier is powered on, the second time period following the first time period, the low power level second amount of power gain determined by decay of the low power level output bias current to a value of the low power level static reference current.

* * * * *